(12) United States Patent
Choi et al.

(10) Patent No.: US 11,193,036 B2
(45) Date of Patent: Dec. 7, 2021

(54) NEUTRAL LAYER COMPOSITION

(71) Applicant: LG Chem, Ltd., Seoul (KR)

(72) Inventors: Eun Young Choi, Daejeon (KR); No Jin Park, Daejeon (KR); Je Gwon Lee, Daejeon (KR); Yoon Hyung Hur, Daejeon (KR); Sung Soo Yoon, Daejeon (KR)

(73) Assignee: LG Chem, Ltd.

( * ) Notice: Subject to any disclaimer, the term of this patent is extended or adjusted under 35 U.S.C. 154(b) by 38 days.

(21) Appl. No.: 16/629,393

(22) PCT Filed: Jul. 16, 2018

(86) PCT No.: PCT/KR2018/008017
§ 371 (c)(1),
(2) Date: Jan. 8, 2020

(87) PCT Pub. No.: WO2019/013601
PCT Pub. Date: Jan. 17, 2019

(65) Prior Publication Data
US 2020/0140716 A1 May 7, 2020

(30) Foreign Application Priority Data
Jul. 14, 2017 (KR) .................. 10-2017-0089867

(51) Int. Cl.
*C09D 133/14* (2006.01)
*C08F 220/32* (2006.01)
*C09D 125/18* (2006.01)
*C08F 212/14* (2006.01)

(52) U.S. Cl.
CPC .......... *C09D 133/14* (2013.01); *C08F 212/20* (2020.02); *C08F 220/325* (2020.02); *C09D 125/18* (2013.01)

(58) Field of Classification Search
CPC ................ C09D 133/14; C09D 125/18; C08F 220/325
USPC ...................................... 428/411.1
See application file for complete search history.

(56) References Cited

U.S. PATENT DOCUMENTS

| 8,691,925 B2 * | 4/2014 | Wu ........................ B82Y 10/00 526/319 |
| 9,458,353 B1 * | 10/2016 | Cheng .................... C08G 64/18 |
| 10,703,897 B2 | 7/2020 | Lee et al. |
| 2013/0078576 A1 * | 3/2013 | Wu ...................... C09D 125/14 430/296 |

(Continued)

FOREIGN PATENT DOCUMENTS

| CN | 103797066 A | 5/2014 |
| CN | 104231514 A | 12/2014 |

(Continued)

OTHER PUBLICATIONS

Extended European Search Report including Written Opinion for Application No. EP18832198.8, dated Jun. 24, 2020, pp. 1-8.

(Continued)

*Primary Examiner* — Michael M. Bernshteyn
(74) *Attorney, Agent, or Firm* — Lerner, David, Littenberg, Krumholz & Mentlik, LLP

(57) ABSTRACT

A neutral layer composition, which is capable of forming a neutral layer that can effectively control orientation characteristics of various block copolymers is provided.

17 Claims, 5 Drawing Sheets

(56) References Cited

U.S. PATENT DOCUMENTS

| | | | |
|---|---|---|---|
| 2014/0030652 A1* | 1/2014 | Senzaki | C08F 212/18 |
| | | | 430/270.1 |
| 2014/0227636 A1 | 8/2014 | Hirano et al. | |
| 2014/0272673 A1 | 9/2014 | Gopalan et al. | |
| 2016/0280835 A1 | 9/2016 | Lee et al. | |
| 2016/0304740 A1 | 10/2016 | Cheng et al. | |
| 2018/0170023 A1 | 6/2018 | Park et al. | |

FOREIGN PATENT DOCUMENTS

| | | | |
|---|---|---|---|
| KR | 20140008296 A | 1/2014 |
| KR | 20140063790 A | 5/2014 |
| KR | 20140084099 A | 7/2014 |
| KR | 20150067063 A | 6/2015 |
| KR | 20150067064 A | 6/2015 |
| WO | 2016195449 A1 | 12/2016 |

OTHER PUBLICATIONS

Search report from International Application No. PCT/KR2018/008017, dated Oct. 16, 2018.

Han, Eungnak, et al., "Photopatternable Imaging Layers for Controlling Block Copolymer Microdomain Orientation." Advanced Materials, vol. 19, No. 24, Revised: Apr. 19, 2007; Published online: Nov. 21, 2007, pp. 4448-4452.

Chinese Search Report for Application No. 201880042317.8, dated Apr. 19, 2021, 3 pages.

* cited by examiner

[Figure 1]
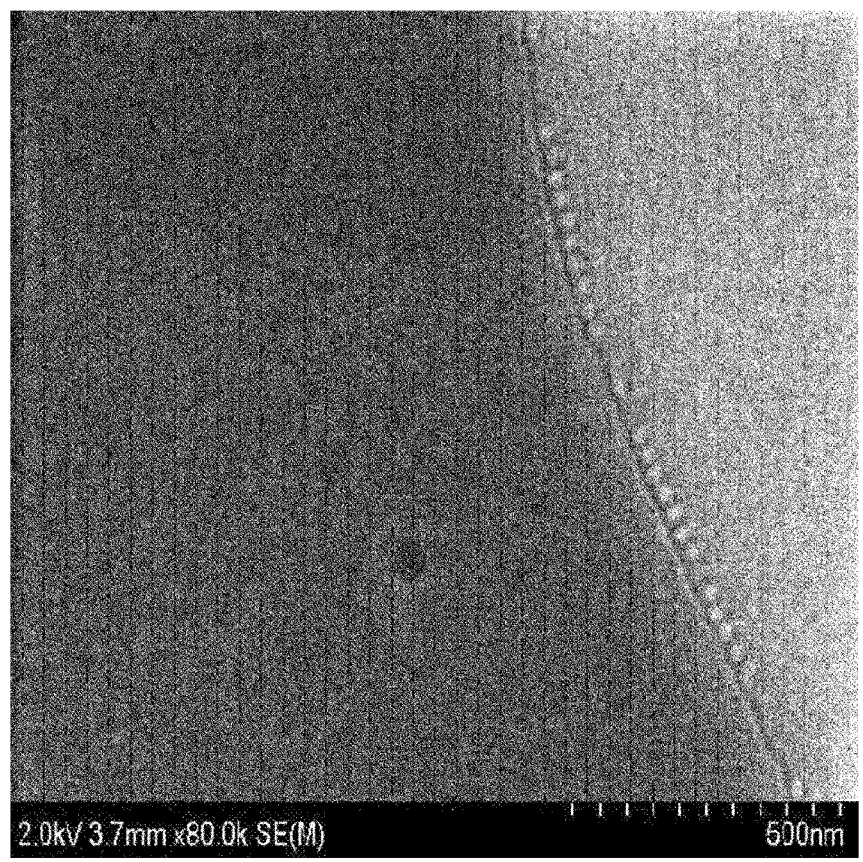

[Figure 2]
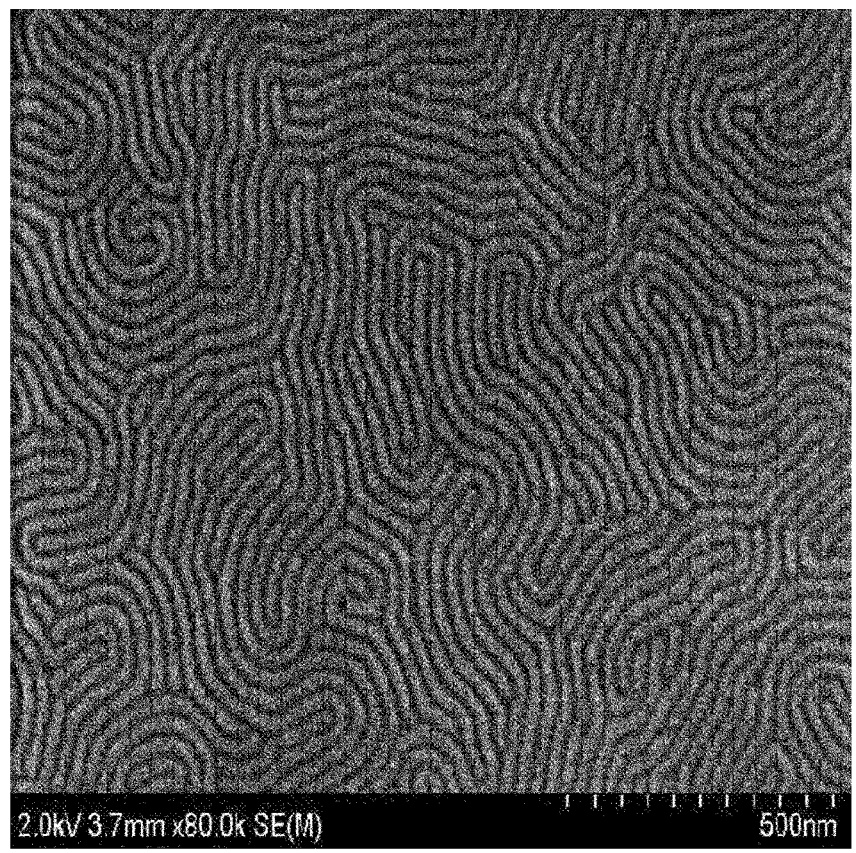

[Figure 3]
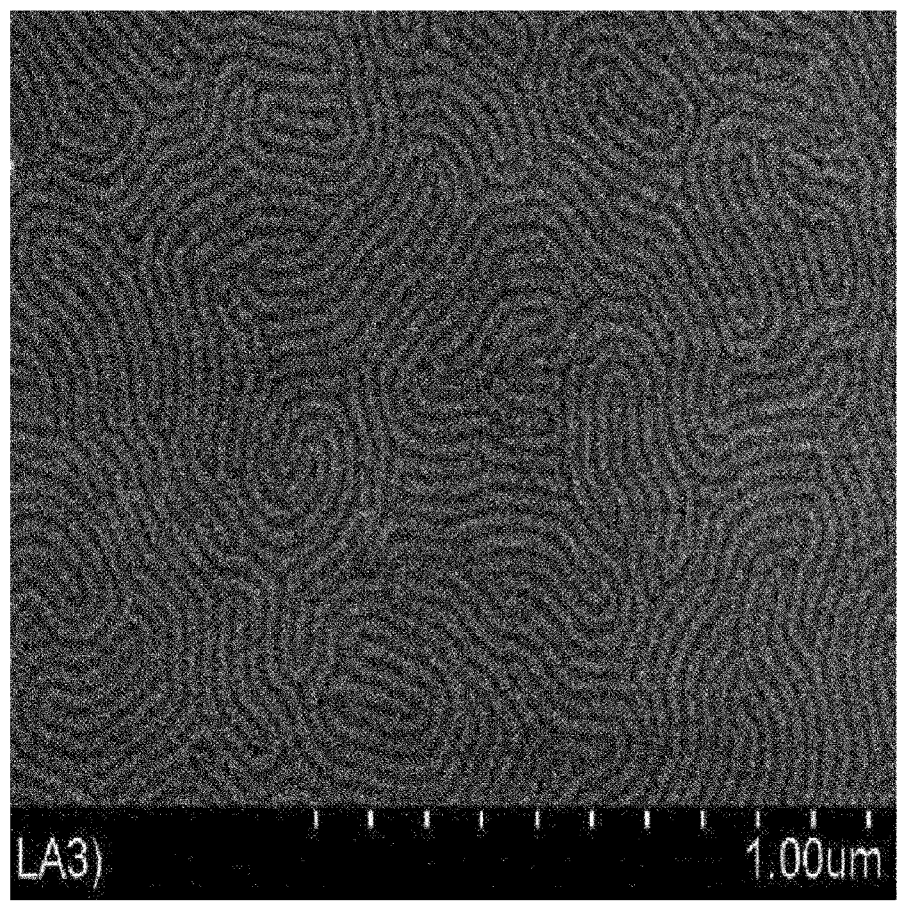

[Figure 4]
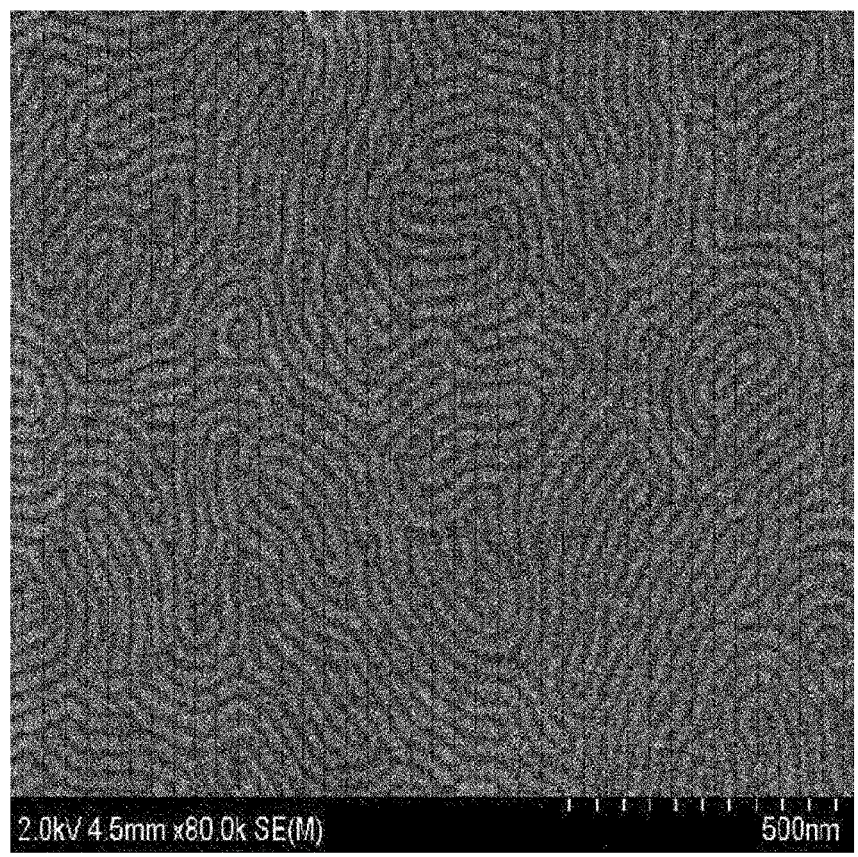

[Figure 5]
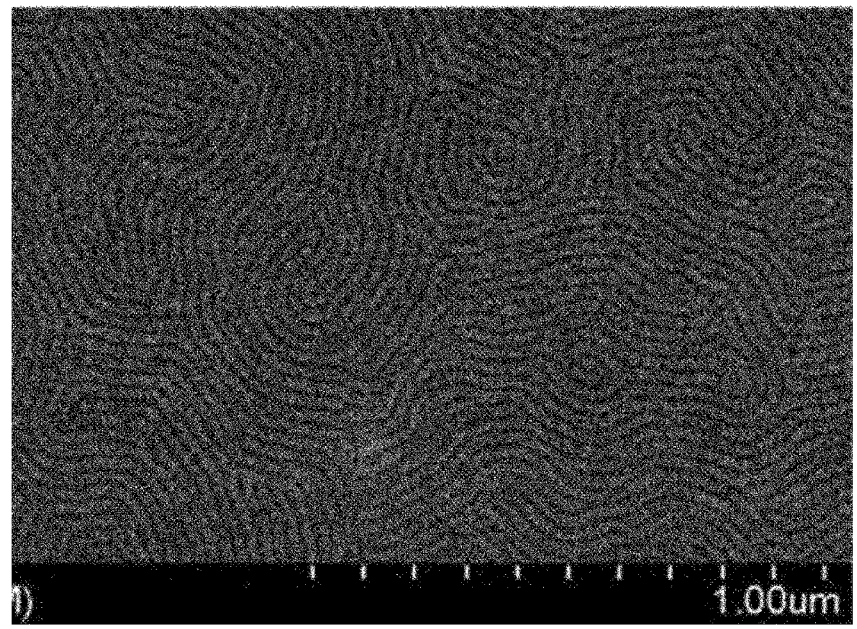
[Figure 6]
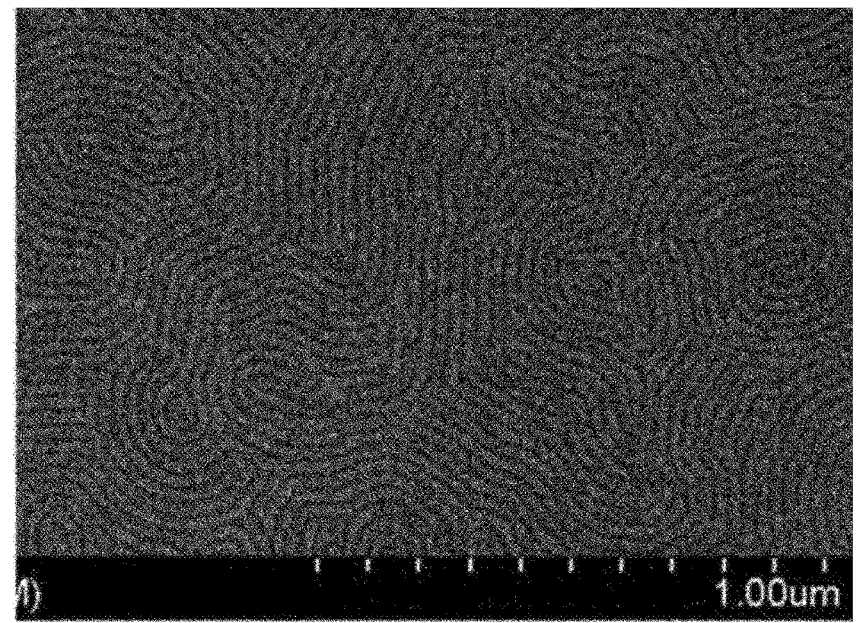

NEUTRAL LAYER COMPOSITION

CROSS-REFERENCE TO RELATED APPLICATIONS

The present application is a national phase entry under 35 U.S.C. § 371 of International Application No. PCT/KR2018/008017 filed on Jul. 16, 2018, which claims priority from Korean Patent Application No. 10-2017-0089867 filed on Jul. 14, 2017, the disclosures of which are incorporated herein by reference.

TECHNICAL FIELD

The present application relates to a neutral layer composition.

BACKGROUND ART

Block copolymers in which two or more chemically different polymer chains are linked by covalent bonds can be separated into regular microphases. The fine phase separation phenomenon of such block copolymers is generally explained by volume fractions, molecular weights and mutual attraction coefficients (Flory-Huggins interaction parameter) among constituents. There are various structures such as nan-scale spheres, cylinders, gyroids or lamellae in the microphase formed by the block copolymer.

An important issue in practical application of block copolymers is to regulate orientation of the microphases. Orientation characteristics of the block copolymers may include a horizontal orientation in which orientation of nanostructures is parallel to the substrate direction and a vertical orientation in which the orientation of the nanostructures is vertical to the substrate direction, among which the vertical orientation is often more important than the vertical orientation.

The orientation of the nanostructures can be determined by selective wetting of blocks in the block copolymer, where a number of substrates are polar and the air is non-polar, so that among blocks of the block copolymer, the blocks with greater polarity are wetted on the substrate and the blocks with smaller polarity are wetted at the interface with the air, and thus the horizontal orientation is induced.

DISCLOSURE

Technical Problem

The present application provides a neutral layer composition. It is one object of the present application to provide a neutral layer composition capable of effectively controlling orientation characteristics such as a vertical orientation of a block copolymer.

Technical Solution

In this specification, the term alkylene group may mean an alkylene group having 1 to 20 carbon atoms, 1 to 16 carbon atoms, 1 to 12 carbon atoms, 1 to 8 carbon atoms, or 1 to 4 carbon atoms, unless otherwise specified. The alkylene group may be a linear, branched or cyclic alkylene group and may optionally be substituted by one or more substituents.

In this specification, the term monovalent or divalent hydrocarbon group may mean a monovalent or divalent residue derived from a compound consisting of carbon and hydrogen or a derivative thereof, unless otherwise specified. Here, as the compound consisting of carbon and hydrogen, alkane, alkene, alkyne or aromatic hydrocarbon can be exemplified.

The term alkane herein may mean alkane having 1 to 20 carbon atoms, 1 to 16 carbon atoms, 1 to 12 carbon atoms, 1 to 8 carbon atoms or 1 to 4 carbon atoms, unless otherwise specified. The alkane may be linear, branched or cyclic and may optionally be substituted by one or more substituents. As the monovalent residue derived from alkane, alkyl can be exemplified, and as the divalent residue, alkylene can be exemplified.

The term alkene herein may mean alkene having 2 to 20 carbon atoms, 2 to 16 carbon atoms, 2 to 12 carbon atoms, 2 to 8 carbon atoms, or 2 to 4 carbon atoms, unless otherwise specified. The alkene may be linear, branched or cyclic and may optionally be substituted by one or more substituents. The monovalent residue derived from alkene can be exemplified by alkenyl and the divalent residue can be exemplified by alkenylene.

The term alkyne herein may mean alkyne having 2 to 20 carbon atoms, 2 to 16 carbon atoms, 2 to 12 carbon atoms, 2 to 8 carbon atoms, or 2 to 4 carbon atoms, unless otherwise specified. The alkyne may be linear, branched or cyclic and may optionally be substituted by one or more substituents. The monovalent residue derived from alkyne can be exemplified by alkynyl and the divalent residue can be exemplified by alkynylene.

In addition, the monovalent residue derived from an aromatic hydrocarbon may be referred to as aryl in the present specification, and the divalent residue may be referred to as arylene. The term aryl group or arylene group herein may mean, unless otherwise specified, a monovalent or divalent residue derived from a compound comprising one benzene ring structure or a structure in which two or more benzene rings are linked while sharing one or two carbon atoms, or linked by any linker, or a derivative thereof. The aryl group or the arylene group may be, for example, an aryl group having 6 to 30 carbon atoms, 6 to 25 carbon atoms, 6 to 21 carbon atoms, 6 to 18 carbon atoms or 6 to 13 carbon atoms, unless otherwise specified.

In the present application, as the substituent with which a substituent such as alkane, alkene, alkyne, alkyl, alkylene, alkenyl, alkenylene, alkynyl, alkynylene, aromatic hydrocarbon, an aryl group or an arylene group or other substituents may be optionally substituted, a hydroxy group, a halogen atom such as fluorine or chlorine, a carboxyl group, a glycidyl group, an acryloyl group, a methacryloyl group, an acryloyloxy group, a methacryloyloxy group, a thiol group, an alkyl group, an alkenyl group, alkynyl group, an alkylene group, an alkenylene group, an alkynylene group, an alkoxy group or an aryl group, and the like can be exemplified, but is not limited thereto.

The present application relates to a neutral layer composition. The term neutral layer composition may mean a composition used for forming a neutral layer. In the present application, the term neutral layer may mean any kind of layer capable of inducing a vertical orientation of a block copolymer. The meaning of the term vertical orientation of block copolymer is well known in the art, and for example, it may mean a case where the block copolymer forms a phase separation structure and the interface of the blocks forming the phase separation structure is formed substantially perpendicular to a substrate.

The neutral layer composition may comprise a random copolymer. In one example, the random copolymer may comprise a unit of Formula 1 below.

[Formula 1]

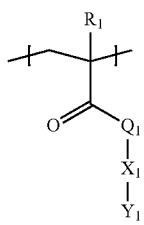

[Formula 1]

In Formula 1, $R_1$ is hydrogen or an alkyl group having 1 to 4 carbon atoms, $Q_1$ is a single bond, —O-$L_1$-C(=O)— or —O-$L_1$- and $X_1$ is —N($R_2$)-$L_2$-C(=O)—O—, O—C(=O)—, —C(=O)—O—, a urethane linker or a urea linker.

Among the definitions of the above formula, the leftmost atom in the structure of the substituent in the definition of $Q_1$ is connected to the carbon atom of the carbonyl group in Formula 1, and the rightmost atom is connected to $X_1$. For example, when $Q_1$ is —O-$L_1$-C(=O)—, the left oxygen atom is connected to the carbon atom of the carbonyl group in Formula 1, and the carbon atom of the carbonyl group of the substituent is connected to $X_1$.

Among the definitions of the above formula, the leftmost atom in the structure of the substituent in the definition of $X_1$ is connected to $Q_1$ of Formula 1, and the rightmost atom is connected to $Y_1$. For example, when $X_1$ is —N($R_2$)-$L_2$-C(=O)—O—, the left nitrogen atom is connected to $Q_1$ in Formula 1, and the rightmost oxygen atom of the substituent is connected to $Y_1$.

Here, the term single bond may mean the case where no separate atom exists in the corresponding part. Therefore, when $Q_1$ in Formula 1 above is a single bond, $Q_1$ is absent and $X_1$ is directly bonded to a carbon atom.

Here, $L_1$ may be an alkylene group having 1 to 4 carbon atoms, $L_2$ may be an alkylene group having 1 to 4 carbon atoms or an alkylidene group having 2 to 4 carbon atoms, $R_2$ may be hydrogen or an alkyl group having 1 to 4 carbon atoms, and $Y_1$ may be a chain having 4 or more chain-forming atoms.

In the definitions of Formula 1 above, the alkyl group, alkylene group or alkylidene group may be linear, branched or cyclic, which may also optionally contain one or more substituents.

In Formula 1, a suitable example of $Q_1$ includes —O-$L_1$-C(=O)— or —O-$L_1$-. In the above case, $L_1$ may be an alkylene group having 1 to 4 carbon atoms, or a methylene group or an ethylene group, and the like, but is not limited thereto.

In Formula 1, a suitable example of $X_1$ may include —N($R_2$)-$L_2$-C(=O)—O—. Here, $L_2$ may be an alkylene group having 1 to 4 carbon atoms or an alkylidene group having 2 to 4 carbon atoms, or may be a methylene group or an ethylene group, and the like, but is not limited thereto.

In Formula 1, $Y_1$ is a chain having 4 or more chain-forming atoms, where the chain may be, for example, a linear chain, preferably $Y_1$ is a hydrocarbon chain having 8 to 20 carbon atoms, and more preferably $Y_1$ is an alkyl group having 8 to 20 carbon atoms.

In the present application, the term chain-forming atom means an atom forming a linear structure of a predetermined chain. The chain may be linear or branched, but the number of chain-forming atoms is calculated by only the number of atoms forming the longest linear chain and other atoms bonded to the chain-forming atoms (for example, if the chain-forming atoms are carbon atoms, hydrogen atoms bonding to the carbon atoms and the like) are not calculated. Also, in the case of a branched chain, the number of chain-forming atoms can be calculated as the number of chain-forming atoms forming the longest chain. For example, when the chain is an n-pentyl group, all of the chain-forming atoms are carbon, where the number is 5, and even if the chain is a 2-methylpentyl group, all of the chain-forming atoms are carbon, where the number is 5. The chain-forming atom may be exemplified by carbon, oxygen, sulfur or nitrogen, and the like, and an appropriate chain-forming atom may be carbon, oxygen or nitrogen, or may be carbon or oxygen. The number of chain-forming atoms may be 5 or more, 6 or more, 7 or more, 8 or more, 9 or more, 10 or more, 11 or more, or 12 or more. The number of the chain forming atoms may also be 30 or less, 25 or less, 20 or less, or 16 or less.

In one example, the chain may be a linear hydrocarbon chain and may, for example, be a linear alkyl group, alkenyl group or alkynyl group. In this case, the alkyl group, alkenyl group or alkynyl group, and the like may be an alkyl group, alkenyl group or alkynyl group, and the like having 4 or more carbon atoms, 5 or more carbon atoms, 6 or more carbon atoms, 7 or more carbon atoms, 8 or more carbon atoms, 8 to 30 carbon atoms, 8 to 25 carbon atoms, 8 to 20 carbon atoms or 8 to 16 carbon atoms. One or more carbon atoms of the alkyl group and the like may be optionally substituted with an oxygen atom, and at least one hydrogen atom of the alkyl group and the like may be optionally substituted with another substituent.

The random copolymer containing the unit of Formula 1 can appropriately control orientation characteristics of various block copolymers and can effectively induce, for example, the vertical orientation of various block copolymers. In a particularly suitable example, the neutral layer composition may effectively form a neutral layer capable of inducing the vertical orientation of a block copolymer comprising, for example, blocks containing the unit of Formula 1 above or consisting of the unit, or blocks of the unit having a structure similar thereto.

The ratio of the unit of Formula 1 in the random copolymer is not particularly limited, and this ratio can be adjusted, for example, according to the kind of the block copolymer to which the neutral layer is applied. In one example, the volume fraction of the unit of Formula 1 in the random copolymer may be in a range of about 10% to 65%. In another example, the volume fraction may be 10% or more, 12% or more, 14% or more, 16% or more, 18% or more, 19% or more, or 20% or more, and may be 65% or less, 63% or less, 61% or less, 59 or less, 58% or less, 57% or less, 56% or less, or 55% or less or so, but is not limited thereto.

In another example, the ratio of the unit of Formula 1 above may be about 1 wt % or more, 5 wt % or more, 10 wt % or more, 15 wt % or more, 20 wt % or more, or 30 wt % or more, or may also be about 90 wt % or less, 85 wt % or less, 80 wt % or less, 75 wt % or less, 70 wt % or less, 65 wt % or less, 60 wt % or less, 55 wt % or less, 50 wt % or less, 45 wt % or less, 40 wt % or less, or 35 wt % or less.

Under the ratio, the random copolymer can form a neutral layer of suitable performance.

The random copolymer may comprise an additional unit together with the unit of Formula 1. As the additional unit, for example, any one of units represented by any one of Formulas 2 to 4 may be exemplified.

Hereinafter, the unit represented by any one of Formulas 2 to 4 above may be referred to as a second unit.

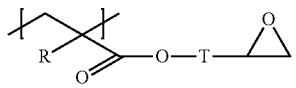
[Formula 2]

In Formula 2, R is hydrogen or an alkyl group, and T is a single bond or a divalent hydrocarbon group containing or not containing a hetero atom.

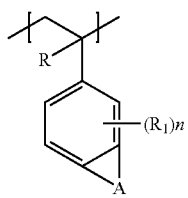
[Formula 3]

In Formula 3, R is hydrogen or an alkyl group, A is an alkylene group, R1 may be hydrogen, a halogen atom, an alkyl group or a haloalkyl group, and n is a number in a range of 1 to 3.

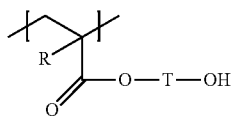
[Formula 4]

In Formula 4, R is hydrogen or an alkyl group, and T is a divalent hydrocarbon group containing or not containing a hetero atom.

In another example, the alkyl group in Formulas 2 to 4 may be an alkyl group having 1 to 20 carbon atoms, 1 to 16 carbon atoms, 1 to 12 carbon atoms, 1 to 8 carbon atoms or 1 to 4 carbon atoms. Such an alkyl group may be linear, branched or cyclic and may optionally be substituted by one or more of the above-described substituents.

The haloalkyl group in Formula 3 is an alkyl group in which at least one hydrogen atom is substituted with a halogen atom, where the alkyl group may be an alkyl group having 1 to 20 carbon atoms, 1 to 16 carbon atoms, 1 to 12 carbon atoms, 1 to 8 carbon atoms, or 1 to 4 carbon atoms. Such a haloalkyl group may be linear, branched or cyclic and may optionally be substituted by one or more of the foregoing substituents. Here, as the halogen atom with which the hydrogen atom is substituted, fluorine or chlorine and the like can be also exemplified.

In another example, the alkylene group of A in Formula 3 may be an alkylene group having 1 to 20 carbon atoms, 1 to 16 carbon atoms, 1 to 12 carbon atoms, 1 to 8 carbon atoms, or 1 to 4 carbon atoms. Such an alkylene group may be linear, branched or cyclic and may optionally be substituted by one or more of the foregoing substituents.

The basic definition of the divalent hydrocarbon group in Formulas 2 to 4 is as described above. The divalent hydrocarbon group of Formulas 2 to 4 may further include a hetero atom, if necessary. Here, the hetero atom is a hetero atom for carbon, and for example, includes oxygen, nitrogen or sulfur, and the like. 1 to 4 or less of such hetero atoms may be included in the divalent hydrocarbon group of Formulas 2 to 4.

Examples of the monomers capable of forming the units of Formulas 2 to 4 are not particularly limited. For example, as the monomer capable of forming the unit of Formula 2, glycidyl (meth)acrylate and the like can be exemplified, as the monomer capable of forming the unit of Formula 3, 4-vinylbenzocyclobutene and the like can be exemplified, as the monomer capable of forming the unit of Formula 4, hydroxymethyl acrylate, hydroxymethyl (meth)acrylate, 2-hydroxyethyl acrylate, 2-hydroxyethyl (meth)acrylate, 2-hydroxypropyl acrylate, 2-hydroxypropyl (meth)acrylate, 3-hydroxypropyl acrylate, 3-hydroxypropyl (meth)acrylate, 2-hydroxybutyl acrylate, 2-hydroxybutyl (meth)acrylate, 4-hydroxybutyl acrylate, 4-hydroxybutyl (meth)acrylate, 6-hydroxyhexyl acrylate or 6-hydroxyhexyl (meth)acrylate and the like can be exemplified, without being limited thereto.

The ratio of the second unit in the random copolymer is not particularly limited, and this ratio can be adjusted, for example, depending on the kind of the block copolymer to which the neutral layer is applied. In one example, the ratio of the second units in the random copolymer may be about 1 mol % to 20 mol % or so, but is not limited thereto. In another example, the ratio may be 18 mol % or less, 16 mol % or less, 14 mol % or less, 12 mol % or less, 10 mol % or less, 8 mol % or less, 6 mol % or less, or 4 mol % or less, or so.

In another example, the second unit may be included in a range of about 0.01 to 100 parts by weight relative to 100 parts by weight of the unit of Formula 1. In another example, the ratio may be about 0.05 part by weight or more, 0.1 part by weight or more, 0.5 part by weight or more, 1 part by weight or more, 2 parts by weight or more, 3 parts by weight or more, 4 parts by weight or more, 5 parts by weight or more, 10 parts by weight or more, 15 parts by weight or more, 20 parts by weight or more, 25 parts by weight or more, or 30 parts by weight or more, or may also be about 90 parts by weight or less, 80 parts by weight or less, 70 parts by weight or less, 60 parts by weight or less, 50 parts by weight or less, 40 parts by weight or less, 30 parts by weight or less, 20 parts by weight or less, 10 parts by weight or less, 9 parts by weight or less, 8 parts by weight or less, 7 parts by weight or less, or 6 parts by weight or less or so.

The units of Formulas 2 to 4 above are units containing at least one crosslinkable unit, where such a unit can allow the neutral layer to be effectively fixed to the substrate. If necessary, at least one of the units of Formulas 2 to 4 may be substituted with an additional crosslinkable functional group, for example, a hydroxyl group, an epoxy group, an isocyanate group, a glycidyl group, a substituent of Formula 8 below, a benzoylphenoxy group, an alkenyloxycarbonyl group, a (meth)acryloyl group or an alkenyloxyalkyl group, and the like.

 [Formula 8]

In Formula 8, Y is a single bond, an alkylene group, an alkenylene group or an alkynylene group, and X is a single bond, an oxygen atom, a sulfur atom, $-S(=O)_2-$, an alkylene group, an alkenylene group, alkynylene group, $-C(=O)-X_1-$ or $-X_1-C(=O)-$, where $X_1$ is a single bond, an oxygen atom, a sulfur atom, $-S(=O)_2-$, an alkylene group, an alkenylene group or an alkynylene group.

The functional group of Formula 8 is a substituent in which a cross-linkable azide residue is present at the terminal, and such a functional group can be cross-linked.

In another example, Y in Formula 8 may be an alkylene group having 1 to 20 carbon atoms, 1 to 16 carbon atoms, 1 to 12 carbon atoms, 1 to 8 carbon atoms, or 1 to 4 carbon atoms.

Also, in another example, X in Formula 8 may be a single bond, an oxygen atom, —C(=O)—O— or —O—C (=O)—, but is not limited thereto.

In addition, the functional group as above, for example, as a hydroxyl group or the like may be bonded to the terminal of the random copolymer having the units of Formulas 2 to 4. Such a random copolymer that a hydroxyl group is bonded to the terminal may be prepared by polymerizing a random copolymer using a RAFT (reversible addition fragmentation chain transfer) agent or an ATRP (atom transfer radiation polymerization) initiator, and the like, that a hydroxyl group is bonded to the terminal.

The random copolymer may comprise an additional unit (hereinafter, third unit) together with the unit of Formula 1 and the second unit above. As such a third unit, a polymerized unit derived from a (meth)acrylic acid ester compound such as methyl (meth)acrylate, ethyl (meth)acrylate, n-propyl (meth)acrylate, isopropyl (meth)acrylate, n-butyl (eth) acrylate, isobutyl (meth)acrylate, t-butyl (meth)acrylate, n-hexyl (meth)acrylate or octyl (meth)acrylate, a polymerized unit derived from vinyl pyridine such as 2-vinyl pyridine or 4-vinyl pyridine, or a polymerized unit derived from a styrenic monomer such as styrene, 4-trimethylsilylstyrene, 2,3,4,5,6-pentafluorostyrene, 3,4,5-trifluorostyrene, 2,4,6-trifluorostyrene or 4-fluorostyrene can be exemplified, but is not limited thereto.

In one example, the random copolymer may further include, as the third unit, a unit represented by Formula 6 below.

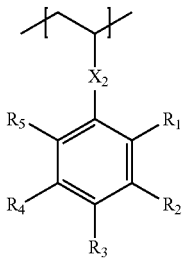

[Formula 6]

In Formula 6, $X_2$ is a single bond, an oxygen atom, a sulfur atom, —S(=O)$_2$—, an alkylene group, an alkenylene group, an alkynylene group, —C(=O)—X$_1$— or —X$_1$—C (=O)—, where $X_1$ is a single bond, an oxygen atom, a sulfur atom, —S(=O)$_2$—, an alkylene group, an alkenylene group or an alkynylene group, and $R_1$ to $R_5$ are each independently hydrogen, an alkyl group, a haloalkyl group or a halogen atom, where the number of halogen atoms contained in $R_1$ to $R_5$ may be 3 or more, or at least 3 or more of $R_1$ to $R_5$ may be halogen atoms.

Here, the number of halogen atoms contained in $R_1$ to $R_5$ or the number of substituents, which are halogen atoms, in $R_1$ to $R_5$ may be 4, 5 or 6 or more, or may also be 10 or less, 9 or less, 8 or less, 7 or less, 6 or less, or 5 or less.

A suitable example of Formula 6 may be a case where $X_2$ is a single bond, an oxygen atom or a sulfur atom, but is not limited thereto.

If necessary, any one of $R_1$ to $R_5$ in the unit of Formula 6 may be the above-mentioned crosslinkable functional group, for example, a functional group of Formula 8 above, a benzoylphenoxy group, an alkenyloxycarbonyl group, a (meth)acryloyl group or an alkenyloxyalkyl group, and the like, or in any one of $R_1$ to $R_5$ above, an alkyl group or a haloalkyl group may also be substituted by the crosslinkable functional group.

Here, the polymerized unit derived from a certain monomer may mean a skeleton structure in which each monomer as described above is polymerized and formed in the random copolymer.

When the third unit is included in the random copolymer, the ratio is not particularly limited and can be adjusted, for example, depending on the kind of the block copolymer to which the neutral layer is applied. In one example, the volume fraction of the third unit in the random copolymer may be about 35% to 90% or so, but is not limited thereto. In another example, the ratio may be about 37% or more, 39% or more, 41% or more, 42% or more, 43% or more, 44% or more, or 45% or more, and may also be 90% or less, 88% or less, 86% or less, 84% or less, 82% or less, 81% or less, or 80% or less.

In another example, the third unit may be included in a range of about 100 to 1,000 parts by weight relative to 100 parts by weight of the unit of Formula 1 above. In another example, the ratio may be about 150 parts by weight or more, or 200 parts by weight or more, or may also be about 900 parts by weight or less, 800 parts by weight or less, 700 parts by weight or less, 600 parts by weight or less, 500 parts by weight or less, 400 parts by weight or less, or 350 parts by weight or less or so.

The random copolymer may have a number average molecular weight (Mn) in a range of, for example, 2,000 to 500,000. In another example, the number average molecular weight may be 3,000 or more, 4,000 or more, 5,000 or more, 6,000 or more, 7,000 or more, 8,000 or more, 9,000 or more, 10,000 or more, 20,000 or more, 30,000 or more, 40,000 or more, 50,000 or more, 60,000 or more, 70,000 or more, 80,000 or more, 90,000 or more, about 100,000 or more, about 150,000 or more, about 200,000 or more, about 250,000 or more, about 300,000 or more, or about 350,000 or more or so. In another example, the number average molecular weight may be about 400,000 or less, 300,000 or less, 200,000 or less, 100,000 or less, 90,000 or less, 80,000 or less, 70,000 or less, 60,000 or less, 50,000 or less, or 40,000 or less. In this specification, the term number average molecular weight is a value converted to standard polystyrene measured by using GPC (gel permeation chromatograph), and the term molecular weight means a number average molecular weight, unless otherwise specified. The molecular weight of the random copolymer can be adjusted in consideration of the physical properties and the like of the neutral layer comprising the random copolymer.

The method for producing the random copolymer is not particularly limited. For example, the random copolymer may be prepared by applying a free radical polymerization method or an LRP (Living Radical Polymerization) method and the like. As an example of the LRP method, anion polymerization in which polymerization is carried out in the presence of an inorganic acid salt such as an alkali metal or alkaline earth metal salt or an organoaluminum compound using an organic rare earth metal complex or an organic alkali metal compound as an initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method, a polymerization method by reversible addition-fragmentation chain transfer (RAFT) using an inorganic reducing agent and a reversible addition-fragmentation chain transfer agent or a method of using an organotellurium compound as an initiator, and the like can be exemplified, and a suitable method may be employed among the above methods.

The kind of the radical initiator that can be used in the polymerization process is not particularly limited. For example, an azo initiator such as AIBN (azobisisobutyronitrile) or 2,2'-azobis-(2,4-dimethylvaleronitrile), ABCN (1,1'-azobis(cyclohexanecarbonitrile)) or a peroxide initiator such as BPO (benzoyl peroxide) or DTBP (di-tert-butyl peroxide) may be applied, and for example, like a method using thermal self initiation of a styrenic monomer, a polymerization method using no initiator may be also applied depending on the type of the monomer.

The polymerization process can be carried out, for example, in a suitable solvent, and in this case, as an applicable solvent, a solvent such as methylene chloride, 1,2-dichloroethane, chlorobenzene, dichlorobenzene, benzene, toluene, anisole, acetone, chloroform, tetrahydrofuran, dioxane, monoglyme, diglyme, dimethylformamide, dimethylsulfoxide or dimethylacetamide can be exemplified, but is not limited thereto. After forming the random copolymer, the random copolymer can be obtained by precipitation using a non-solvent, where as the usable non-solvent, an alcohol such as methanol, ethanol, n-propanol or isopropanol, a glycol such as ethylene glycol, an ether solvent or petroleum ether, and the like can be exemplified, but is not limited thereto.

In the field of polymer synthesis, a method for producing a polymer by performing polymerization depending on a monomer forming the polymer is known, and any of the above methods may be applied upon producing the random copolymer of the present application.

The neutral layer composition comprising the random copolymer as described above may comprise only the predetermined random copolymer or, if necessary, other components in addition to the random copolymer. The neutral layer composition may comprise at least the random copolymer as the main component. The inclusion as the main component herein may mean that the corresponding composition comprises only the random copolymer, or comprises 50 wt % or more, 55 wt % or more, 60 wt % or more, 65 wt % or more, 70 wt % or more, 75 wt % or more, 80 wt % or more, 85 wt % or more, or 90 wt % or more. In another example, the ratio may be about 100 wt % or less or about 99 wt % or less or so. In addition, as other components that can be included together with the random copolymer, for example, thermal initiators or photoinitiators necessary when the random copolymer contains the above-mentioned photo-cross-linkable or thermo-cross-linkable functional group and the like can be exemplified.

Also, here, when the neutral layer composition comprises a solvent, the weight ratio of the random copolymer may be a weight based on the total weight of the components excluding the solvent.

The present application also relates to a neutral layer comprising the random copolymer. In the present application, the term neutral layer means a layer capable of inducing the vertical orientation of the block copolymer as described above.

The neutral layer may be formed on a suitable substrate. As the substrate on which the neutral layer is formed, a silicon wafer, a silicon oxide substrate, a silicon nitride substrate, or a cross-linked PET (poly(ethylene terephthalate)) film, and the like can be exemplified, but is not limited thereto.

The neutral layer can be formed using the above-described neutral layer composition, for example, the random copolymer comprising the above-described unit of Formula 1. For example, the process of forming the neutral layer may comprise steps of coating the neutral layer composition on the substrate and fixing the layer of the coated neutral layer composition. Here, the method for coating the neutral layer composition on the substrate is not particularly limited, and for example, a method such as bar coating, spin coating or comma coating may be applied, and coating by a roll-to-roll method may be also applied.

The method for fixing the layer of the neutral layer composition is not particularly limited, and for example, a method for inducing covalent bonds between the layer and the substrate by a suitable manner or inducing a chemical cross-linking reaction in the layer, and the like may be applied. For example, when the above process is performed by heat treatment, the heat treatment may be controlled within a range of about 100° C. to 250° C. or about 100° C. to 200° C. Also, the time required for the heat treatment may be varied as needed, and may be adjusted, for example, within a range of about 1 minute to 72 hours or about 1 minute to 24 hours. The temperature and time of the heat treatment may be adjusted to an appropriate level in consideration of the type of the functional group of the random copolymer in the neutral layer composition, and the like.

The neutral layer may have, for example, a thickness of about 2 nm to 100 nm, and in another example, it may have a thickness of about 2 nm to 50 nm. Within the thickness range, there may be benefits that the surface uniformity of the neutral layer can be maintained, the vertical orientation of the block copolymer can be induced, and then etching selectivity cannot be damaged during the etching process.

The present application also relates to a laminate comprising a neutral layer comprising the random copolymer, and a polymer membrane formed on one surface of the neutral layer and comprising a block copolymer having a first block and a second block chemically distinct from the first block.

The polymer membrane in the above laminate may be used in various applications, and for example, may be used in various electron or electronic elements, a process of forming the pattern or a recording medium such as a magnetic storage medium and a flash memory or a biosensor and the like, or a process of manufacturing a separation membrane, and the like.

In one example, the block copolymer in the polymer membrane may embody a cyclic structure, including a sphere, a cylinder, a gyroid or a lamellar, and the like through self-assembly. In the case of the sphere or the lamella of the above structures, the block copolymer may be in a vertically oriented state.

For example, in the segments of the first or second block or other blocks covalently bonded thereto in the block copolymer, other segments may be vertically oriented, while forming a regular structure such as a lamellar shape or a cylinder shape.

The block copolymer that can be included in the polymer membrane in the above-described laminate is not particularly limited.

For example, the block copolymer may include, as the first block, a unit represented by Formula 1 below.

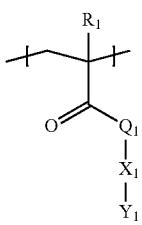

[Formula 1]

In Formula 1, $R_1$ is hydrogen or an alkyl group having 1 to 4 carbon atoms, $Q_1$ is a single bond, —O-$L_1$-C(=O)— or —O-$L_1$- and $X_1$ is —N($R_2$)(=O)—O—, O—C(=O)—, —C(=O)—O—, a urethane linker or a urea linker, where $L_1$ is an alkylene group having 1 to 4 carbon atoms, $L_2$ is an alkylene group having 1 to 4 carbon atoms, or an alkylidene group having 2 to 4 carbon atoms, $R_2$ is hydrogen or an alkyl group having 1 to 4 carbon atoms and $Y_1$ is a chain having 4 or more chain-forming atoms.

Specific details of each substituent and the chain in the unit may be the same as those of the unit of Formula 1 of the above-mentioned random copolymer.

As the block copolymer comprises the unit of Formula 1 above, the self-assembled structure on the above-mentioned neutral layer may exhibit excellent phase separation characteristics and may be vertically oriented, while forming a regular structure such as a lamellar shape or a cylinder shape.

In the block copolymer, the kind of the second block included together with the first block is not particularly limited. For example, as the second block, a polyvinyl pyrrolidone block, a polylactic acid block, a polyvinyl pyridine block, a polystyrene block such as polystyrene or polytrimethylsilyl styrene, a poly(perfluorostyrene) block such as poly(2,3,4,5,6-pentafluorostyrene), a poly(meth)acrylate block such as poly(methylmethacrylate), a polyalkylene oxide block such as polyethylene oxide, a polybutadiene block, a polyisoprene block, or a polyolefin block such as polyethylene can be exemplified.

As the second block, a block including the units of Formulas 2 to 4 and/or the unit of Formula 6, as described above, and the like may be also used.

The block copolymer of the present application may be a diblock copolymer including the first block and the second block as described above, or a multi-block copolymer including two or more of at least one of the first block and the second block, or another kind of a third block.

The number average molecular weight (Mn) of the block copolymer may be, for example, in the range of 2,000 to 500,000.

In another example, the number average molecular weight of the block copolymer may be about 3,000, 4,000 or more, 5,000 or more, 6,000 or more, 7,000 or more, 8,000 or more, 9,000 or more, 10,000 or more, 15,000 or more, 20,000 or more, 25,000 or more, 30,000 or more, 35,000 or more, or 40,000 or more, or may also be about 450,000 or less, 400,000 or less, 350,000 or less, 300,000 or less, 250,000 or less, 200,000 or less, 150,000 or less, 100,000 or less, 90,000 or less, 80,000 or less, 70,000 or less, 60,000 or less, 50,000 or less, or 45,000 or less.

The block copolymer may have polydispersity (Mw/Mn) in a range of 1.01 to 1.50. In another example, the polydispersity may be about 1.45 or less, about 1.4 or less, about 1.35 or less, about 1.3 or less, or about 1.25 or less or so.

In this range, the block copolymer can exhibit proper self-assembly characteristics. The number average molecular weight of the block copolymer and the like can be adjusted in consideration of the desired self-assembly structure and the like When the block copolymer comprises at least the first and second blocks, the first block, for example, the block including the unit of Formula 1 as described above, in the block copolymer may have a ratio in the range of 10 mol % to 90 mol %.

In another example, the block copolymer may comprise the second block in a range of about 10 to 10,000 parts by weight relative to 100 parts by weight of the first block having the unit of Formula 1 above. In another example, the ratio of the second block may be 20 parts by weight or more, 30 parts by weight or more, 40 parts by weight or more, 50 parts by weight or more, 60 parts by weight or more, 70 parts by weight or more, 80 parts by weight or more, 90 parts by weight or more, 100 parts by weight or more, 150 parts by weight or more, 200 parts by weight or more, 250 parts by weight or more, 300 parts by weight or more, 350 parts by weight or more, or 400 parts by weight or more, or may be about 9,000 parts by weight or less, 8,000 parts by weight or less, 7,000 parts by weight or less, 6,000 parts by weight or less, 5,000 parts by weight or less, 4,000 parts by weight or less, 3,000 parts by weight or less, 2,000 parts by weight or less, 1,000 parts by weight or less, 900 parts by weight or less, 800 parts by weight or less, 700 parts by weight or less, 600 parts by weight or less, or 500 parts by weight or less or so.

The specific method for producing the block copolymer in the present application is not particularly limited as long as it comprises the step of forming at least one block of the block copolymer using the above-mentioned monomer.

For example, the block copolymer can be prepared by the LRP (Living Radical Polymerization) method using the above monomers. For example, there are anion polymerization in which polymerization is carried out in the presence of an inorganic acid salt such as an alkali metal or alkaline earth metal salt or an organoaluminum compound using an organic rare earth metal complex or an organic alkali metal compound as an initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method, a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected and applied among the above methods.

For example, the block copolymer can be prepared in a manner which comprises polymerizing a reactant containing monomers capable of forming the block in the presence of a radical initiator and a living radical polymerization reagent by the living radical polymerization method.

The method for forming other blocks included in the copolymer, together with the block formed by using the monomer, upon producing the block copolymer is not particularly limited, and the other blocks may be formed by selecting a suitable monomer in consideration of the kind of the desired block.

The process for preparing the block copolymer may further comprise, for example, a step of precipitating the polymerization product produced through the above process in the non-solvent.

The kind of the radical initiator is not particularly limited, may be appropriately selected in consideration of the polymerization efficiency, and for example, an azo compound such as AIBN (azobisisobutyronitrile), ABCN (1,1'-azobis(cyclohexanecarbonitrile)) or 2,2'-azobis-(2,4-dimethylvaleronitrile), or peroxide series such as BOP (benzoyl peroxide) or DTBP (di-t-butyl peroxide) may be used.

The living radical polymerization process can be carried out in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethylsulfoxide or dimethylacetamide.

As the non-solvent, an alcohol such as methanol, ethanol, normal propanol or isopropanol, a glycol such as ethylene glycol, ether series such as n-hexane, cyclohexane, n-heptane or petroleum ether, and the like can be used, but is not limited thereto.

The method for forming the polymer membrane as above using the block copolymer is not particularly limited. For example, the method may comprise forming the polymer membrane comprising the block copolymer, in a self-assembled state, on the neutral layer. For example, the method may comprise a process of forming a layer of the block copolymer or a coating liquid in which the block copolymer is diluted in an appropriate solvent, on the neutral layer by application or the like and, if necessary, annealing or heat-treating the layer. In another embodiment, the method for manufacturing a laminate comprises forming the neutral layer and forming a polymer membrane formed on one surface of the neutral layer and containing a block copolymer having a first block and a second block different from the first block in a self-assembled state.

The annealing or heat treatment may be performed, for example, based on the phase transition temperature or the glass transition temperature of the block copolymer, and for example, may be performed at a temperature above the glass transition temperature or the phase transition temperature. The time for performing this heat treatment is not particularly limited, and the heat treatment can be performed within a range of, for example, about 1 minute to 72 hours, but this can be changed as needed. In addition, the heat treatment temperature of the polymer thin membrane may be, for example, 100° C. to 250° C. or so, but this can be changed in consideration of the block copolymer to be used.

In another example, the formed layer may be also subjected to solvent annealing in a non-polar solvent and/or a polar solvent at room temperature for about 1 minute to 72 hours.

The present application also relates to a pattern forming method. The method may comprise, for example, selectively removing the first or second block of the block copolymer from the polymer membrane of the laminate. The method may be a method for forming a pattern on the substrate. For example, the method may comprise forming the polymer membrane comprising the block copolymer on the substrate, selectively removing one or more blocks of the block copolymer present in the membrane, and then etching the substrate. In this way, it is possible to form, for example, nanoscale fine patterns. In addition, various types of patterns such as nanorods or nanoholes can be formed through the above method depending on the type of the block copolymer in the polymer membrane. If necessary, the block copolymer may be mixed with other copolymers or homopolymers for pattern formation. The type of the substrate to be applied to this method is not particularly limited, which may be selected as needed, and for example, silicon oxide or the like may be applied.

For example, the method can form a nanoscale pattern of silicon oxide that exhibits a high aspect ratio. For example, after forming the polymer membrane on silicon oxide and selectively removing any one block of the block copolymer in a state where the block copolymer in the polymer membrane forms a predetermined structure, silicon oxide may be etched in various ways, for example, reactive ion etching or the like to embody various shapes including patterns of nanorods or nanoholes. In addition, it is possible to embody nano patterns having a large aspect ratio through this method.

For example, the pattern can be implemented on a scale of several tens of nanometers, and such a pattern can be utilized in various applications including, for example, next-generation information electronic magnetic recording media and the like.

Here, the method for selectively removing any one block of the block copolymer is not particularly limited, and for example, a method for removing a relatively soft block by irradiating the polymer membrane with an appropriate electromagnetic wave, for example, ultraviolet and the like can be used. In this case, the ultraviolet irradiation conditions are determined depending on the type of block of the block copolymer, and for example, the method can be performed, for example, by irradiating it with ultraviolet having a wavelength of about 254 nm for 1 minute to 60 minutes.

In addition, the ultraviolet irradiation may be followed by a step of treating the polymer membrane with an acid or the like to further remove the segment decomposed by ultraviolet.

In addition, the step of etching the substrate using as a mask the polymer membrane, in which the block is selectively removed, is not particularly limited, which may be performed, for example, through the reactive ion etching step using $CF_4$/Ar ions or the like, and following this process, a step of removing the polymer membrane from the substrate by an oxygen plasma treatment or the like can be also performed.

Advantageous Effects

The present application may provide a neutral layer composition capable of forming a neutral layer capable of effectively controlling orientation characteristics of various block copolymers.

BRIEF DESCRIPTION OF DRAWINGS

FIG. 1 is an SEM photograph of a polymer membrane according to a comparative example of the present application.

FIGS. 2 to 6 are SEM photographs of self-assembled structures of block copolymers formed on random copolymers of Examples 1 to 5 of the present application, respectively.

MODE FOR INVENTION

Hereinafter, the present application will be described more in detail by way of examples according to the present application and comparative examples, but the scope of the present application is not limited by the following examples.

1. NMR Measurement

The NMR analysis was performed at room temperature using an NMR spectrometer including a Varian Unity Inova (500 MHz) spectrometer with a triple resonance 5 mm probe. An analyte was diluted in a solvent for measuring NMR (CDCl$_3$) to a concentration of about 10 mg/ml and used, and chemical shifts were expressed in ppm.

<Application Abbreviations> br=wide signal, s=singlet, d=doublet, dd=double doublet, t=triplet, dt=double triplet, q=quartet, p=quintet, m=muliplet.

2. GPC (Gel Permeation Chromatograph)

The number average molecular weight (Mn) and the molecular weight distribution were measured using GPC (Gel Permeation Chromatography). Analytes such as the block copolymers of Examples or Comparative Examples or macro initiators are introduced into a 5 mL vial and diluted in THF (tetrahydrofuran) so as to be a concentration of about 1 mg/mL. Then, the calibration standard sample and the sample to be analyzed were filtered through a syringe filter (pore size: 0.45 m) and then measured. As an analytical program, ChemStation from Agilent Technologies was used, and the elution time of the sample was compared with the calibration curve to obtain the weight average molecular weight (Mw) and the number average molecular weight (Mn), respectively, and to calculate the molecular weight distribution (PDI) from the ratio (Mw/Mn). The measurement conditions of GPC are as follows.

<GPC Measurement Conditions>

Device: 1200 series from Agilent Technologies

Column: using two PLgel mixed B from Polymer laboratories

Solvent: THF

Column temperature: 35° C.

Sample concentration: 1 mg/mL, 200 μL injection

Standard samples: polystyrene (Mp: 3900000, 723000, 316500, 52200, 31400, 7200, 3940, 485)

Preparation Example 1. Synthesis of Compound (A)

The compound of Formula A below was synthesized in the following manner. Boc-glycine (10.0 g, 57.1 mmol) and 1-dodecanol (11.5 g, 68.5 mmol) were placed in a flask and dissolved in methylene chloride (MC) (300 mL), followed by adding DCC (N,N'-dicyclohexylcarbodiimide) (14.4 g, 68.5 mmol) and DMAP (p-dimethylaminopyridine) (2.8 g, 22.8 mmol) sequentially. The mixture was stirred at room temperature and subjected to reaction overnight, and then filtered to remove solids. The remaining solution was collected and subjected to a column with an EA (ethyl acetate)/hexane solution (EA:hexane=1:5) to obtain a colorless liquid intermediate A1.

The intermediate A1 was placed in a flask, dissolved in 1,4-dioxane (120 mL) and then a hydrochloric acid solution (4N in 1,4-dioxane, 60 mL) was added thereto while stirring in an ice bath, and the mixture was reacted at room temperature overnight. An excessive amount of MC was added to the reaction solution, which was filtered, and the solid content was washed several times with MC to obtain a white solid intermediate A2 (13.0 g, 46.5 mmol), which was dried in a vacuum oven, and then the following reaction was performed.

<NMR Analysis Results>

$^1$H-NMR (CDCl$_3$): δ8.44 (s, 3H); δ4.13 (t, 2H); δ3.76 (s, 2H); δ1.58 (tt, 2H); δ1.30-1.23 (m, 18H); δ0.88 (t, 3H).

The intermediate A2 (13.0 g, 46.5 mmol) was placed in a flask, MC (150 mL) was added to disperse it, and chloroacetyl chloride (10.5 g, 92.9 mmol) was added thereto. TEA (tetraethylammonium) (14.1 g, 139.4 mmol) was slowly added with stirring in an ice bath and the mixture was reacted overnight at room temperature. After the reaction was completed, the solid content was removed by a filter, and the remaining solution was collected and subjected to a column with an EA/hexane (1:5) solution, and the obtained solid was washed with hexane to remove impurities, thereby obtaining a white solid intermediate A3 (11.1 g, 34.7 mmol).

<NMR Analysis Results>

$^1$H-NMR (CDCl$_3$): δ7.07 (s, 1H); δ4.17 (t, 2H); δ4.09 (s, 2H); δ4.08 (d, 2H); δ1.65 (tt, 2H); δ1.40-1.26 (m, 18H); δ0.88 (t, 3H)

The intermediate A3 (11.1 g, 34.7 mmol) and methacrylic acid (12.0 g, 138.8 mmol) are placed in a flask and dissolved in dimethylformamide (DMF) (200 mL) with stirring, and then potassium carbonate (28.8 g, 208.2 mmol) and potassium iodide (0.58 g, 3.48 mmol) are added thereto. The mixture was reacted at 80° C. for 2 hours, to which excess water was poured, and extracted with diethyl ether. The organic layer was collected, dried over magnesium sulfate and subjected to a column after removing the solvent to obtain a compound of Formula A below as a white solid phase (11.8 g, 31.9 mmol).

<NMR Analysis Results>

$^1$H-NMR (CDCl$_3$): δ6.67 (s, 1H); δ6.23 (s, 1H); δ5.71 (s, 1H); δ4.70 (s, 2H); δ4.17 (t, 2H); δ4.09 (d, 2H), δ2.02 (s, 3H), δ1.65 (tt, 2H). δ1.34-1.26 (m, 18H); δ0.88 (t, 3H)

[Formula A]

In Formula A, R$_1$ is methyl, Q$_1$ is —O-L$_1$-C(=O)— and X$_1$ is —N(R$_2$)-L$_2$-C(=O)—O—, where L$_1$ and L$_2$ are methylene and R$_2$ is hydrogen, and Y$_1$ is a dodecyl group.

Preparation Example 2. Synthesis of Block Copolymer (A)

3 g of the compound of Formula A in Preparation Example 1, 3.3 mg of 1,1'-azobis(cyclohexane-1-carbonitrile), 33.3 mg of CPCDB (2-cyano-2-propyl 4-cyanobenzodithioate) (33.3 mg) as an RAFT agent (reversible addition-fragmentation chain transfer agent) and 12.1 g of anisole were placed in a flask, stirred at room temperature for 1 hour under a nitrogen atmosphere and then subjected to RAFT polymerization in a silicone oil vessel at 95° C. for about 1 hour. After the polymerization, the reaction solution was precipitated twice in 400 mL of methanol, and then filtered under reduced pressure and dried to synthesize a polymer of the compound of Formula A above, in which the RAFT reagent was bonded to the terminal, as a macro initiator (number average molecular weight Mn: 13,500, molecular weight distribution PDI: 1.17).

0.5 g of the macro initiator, 2.16 g of pentafluorostyrene and 0.9 mg of 1,1'-azobis(cyclohexane-1-carbonitrile) were dissolved in 2.66 g of trifluorotoluene in a flask, stirred at room temperature for 1 hour under a nitrogen atmosphere and then subjected to RAFT polymerization in a silicone oil vessel at 95° C. for about 20 hours. After the polymerization, the reaction solution was precipitated twice in 400 mL of methanol and then filtered under reduced pressure to synthesize a target block copolymer (number average molecular weight Mn: 40,300, molecular weight distribution PDI: 1.21).

Preparation Example 3. Synthesis of Random Copolymer (B)

0.52 g of the compound of Formula A in Preparation Example 1, 33 mg of AIBN (azobisisobutyronitrile), 1.48 g of pentafluorostyrene, 142 mg of GMA (glycidyl methacrylate) and 2.17 g of tetrahydrofuran were placed in a flask, stirred at room temperature for 1 hour under a nitrogen atmosphere and then subjected to free radical polymerization (FRP) in a silicone oil vessel at 60° C. for about 12 hours. After the polymerization, the reaction solution was precipitated twice in 400 mL of methanol, and then filtered under reduced pressure and dried to synthesize a random copolymer of the compound of Formula A above (number average molecular weight Mn: 37,400, molecular weight distribution PDI: 1.98).

Preparation Example 4. Synthesis of Random Copolymer (C)

0.68 g of the compound of Formula A in Preparation Example 1, 33 mg of AIBN (azobisisobutyronitrile), 1.39 g of pentafluorostyrene, 142 mg of GMA (glycidyl methacrylate) and 2.25 g of tetrahydrofuran were placed in a flask, stirred at room temperature for 1 hour under a nitrogen atmosphere and then subjected to free radical polymerization (FRP) in a silicone oil vessel at 60° C. for about 12 hours. After the polymerization, the reaction solution was precipitated twice in 400 mL of methanol, and then filtered under reduced pressure and dried to synthesize a random copolymer of the compound of Formula A above (number average molecular weight Mn: 35,700, molecular weight distribution PDI: 1.98).

Preparation Example 5. Synthesis of Random Copolymer (D)

1.70 g of the compound of Formula A in Preparation Example 1, 32 mg of AIBN (azobisisobutyronitrile), 5.82 g of pentafluorostyrene, 0.1 g of HEMA (2-hydroxymethyl methacrylate) and 7.52 g of tetrahydrofuran were placed in a flask, stirred at room temperature for 1 hour under a nitrogen atmosphere and then subjected to free radical polymerization (FRP) in a silicone oil vessel at 60° C. for about 12 hours. After the polymerization, the reaction solution was precipitated twice in 400 mL of methanol, and then filtered under reduced pressure and dried to synthesize a random copolymer of the compound of Formula A above (number average molecular weight Mn: 31,800, molecular weight distribution PDI: 1.91).

Preparation Example 6. Synthesis of Compound (B)

The compound (B) was synthesized in the same manner as in Preparation Example 1, except that 1-octanol was used instead of 1-dodecanol. NMR analysis results for the compound were shown below. As the compound (B), a compound was synthesized, in which in Formula A of Preparation Example 1, $R_1$ is methyl, $Q_1$ is —O-$L_1$-C(=O)— and $X_1$ is —N($R_2$)-$L_2$-C(=O)—O—, where $L_1$ and $L_2$ are methylene and $R_2$ is hydrogen, and $Y_1$ is an octyl group.

<NMR Analysis Results>
$^1$H-NMR (CDCl$_3$): δ6.67 (s, 1H); δ6.24 (s, 1H); δ5.71 (s, 1H); δ4.70 (s, 2H); δ4.17 (t, 2H); δ4.09 (d, 2H), δ2.02 (s, 3H), δ1.65 (tt, 2H). δ1.34-1.26 (m, 10H); δ0.88 (t, 3H)

Preparation Example 7. Synthesis of Compound (C)

The compound (C) was synthesized in the same manner as in Preparation Example 1, except that 1-hexadecanol was used instead of 1-dodecanol. The compound (C) is a compound, in which in Formula A of Preparation Example 1, $R_1$ is methyl, $Q_1$ is —O-$L_1$-C(=O)— and $X_1$ is —N($R_2$)-$L_2$-C(=O)—O—, where $L_1$ and $L_2$ are methylene and $R_2$ is hydrogen, and $Y_1$ is an hexadecyl group. NMR analysis results for the compound were shown below.

<NMR Analysis Results>
$^1$H-NMR (CDCl$_3$): δ6.67 (s, 1H); δ6.24 (s, 1H); δ5.71 (s, 1H); δ4.70 (s, 2H); δ4.17 (t, 2H); δ4.09 (d, 2H), δ2.02 (s, 3H), δ1.65 (tt, 2H). δ1.34-1.26 (m, 26H); δ0.88 (t, 3H)

Preparation Example 8. Synthesis of Random Copolymer (E)

0.44 g of the compound (B) of Preparation Example 6, 33 mg of AIBN (azobisisobutyronitrile), 1.48 g of pentafluorostyrene, 142 mg of GMA (glycidyl methacrylate) and 2.09 g of tetrahydrofuran were placed in a flask, stirred at room temperature for 1 hour under a nitrogen atmosphere and then subjected to free radical polymerization (FRP) in a silicone oil vessel at 60° C. for about 12 hours.

After the polymerization, the reaction solution was precipitated twice in 400 mL of methanol, and then filtered under reduced pressure and dried to synthesize a random copolymer (E) containing the unit of the compound (B) (number average molecular weight (Mn): 33,700 molecular weight distribution PDI): 1.92).

Preparation Example 9. Synthesis of Random Copolymer (F)

0.60 g of the compound (C) of Preparation Example 7, 33 mg of AIBN (azobisisobutyronitrile), 1.48 g of pentafluorostyrene, 142 mg of GMA (glycidyl methacrylate) and 2.25 g of tetrahydrofuran were placed in a flask, stirred at room temperature for 1 hour under a nitrogen atmosphere and then subjected to free radical polymerization (FRP) in a silicone oil vessel at 60° C. for about 12 hours. After the polymerization, the reaction solution was precipitated twice in 400 mL of methanol, and then filtered under reduced pressure and dried to synthesize a random copolymer (F) (number average molecular weight Mn: 40,300 molecular weight distribution PDI: 2.02).

Comparative Example 1. Self-Assembly of Block Copolymer (A)

A self-assembled polymer membrane was formed using the block copolymer (A) of Preparation Example 2 and the results were confirmed. Specifically, the copolymer was dissolved in fluorobenzene at a concentration of about 1.0 wt %, and the prepared coating liquid was spin-coated on a silicon wafer at a speed of 3000 rpm for 60 seconds and then subjected to thermal annealing at about 200° C. to form a membrane comprising the self-assembled block copolymer. FIG. 1 is an SEM image of the polymer membrane formed as described above. It can be confirmed from the drawing that the orientation of the polymer membrane has been not properly formed.

Example 1. Self-Assembly of the Block Copolymer (A) Introducing the Neutral Layer of the Random Copolymer (B)

Using the random copolymer (B) of Preparation Example 3 and the block copolymer (A) of Preparation Example 2, a cross-linked neutral layer and a self-assembled polymer membrane were formed, respectively, and the results were confirmed. Specifically, the random copolymer (B) of Preparation Example 3 was first dissolved in fluorobenzene at a concentration of about 0.5 wt %, and the prepared coating liquid was spin-coated on a silicon wafer at a speed of 3000 rpm for 60 seconds, and then subjected to thermal cross-linking at about 200° C. to form a cross-linked neutral layer. The block copolymer (A) was dissolved in fluorobenzene at a concentration of about 1.0 wt %, and the prepared coating solution was spin-coated on the neutral layer at a rate of 3000 rpm for 60 seconds, and then subjected to thermal annealing at about 200° C. to form a membrane comprising the self-assembled block copolymer. FIG. 2 is an SEM image of the polymer membrane formed as described above. It can be confirmed from the drawing that a proper lamellar vertical orientation structure has been formed.

Example 2. Self-Assembly of the Block Copolymer (A) Introducing the Neutral Layer of the Random Copolymer (C)

Using the random copolymer (C) of Preparation Example 4 and the block copolymer (A) of Preparation Example 2, a cross-linked neutral layer and a self-assembled polymer membrane were formed, respectively, and the results were confirmed. Specifically, the random copolymer (C) of Preparation Example 4 was first dissolved in fluorobenzene at a concentration of about 0.5 wt %, and the prepared coating liquid was spin-coated on a silicon wafer at a speed of 3000 rpm for 60 seconds, and then subjected to thermal cross-linking at about 200° C. to form a cross-linked neutral layer. The block copolymer (A) was dissolved in fluorobenzene at a concentration of about 1.0 wt %, and the prepared coating solution was spin-coated on the neutral layer at a rate of 3000 rpm for 60 seconds, and then subjected to thermal annealing at about 200° C. to form a membrane comprising the self-assembled block copolymer. FIG. 3 is an SEM image of the polymer membrane formed as described above. It can be confirmed from the drawing that a proper lamellar vertical orientation structure has been formed.

Example 3. Self-Assembly of the Block Copolymer (A) Introducing the Neutral Layer of the Random Copolymer (D)

Using the random copolymer (D) of Preparation Example 5 and the block copolymer (A) of Preparation Example 2, a cross-linked neutral layer and a self-assembled polymer membrane were formed, respectively, and the results were confirmed. Specifically, the random copolymer (D) of Preparation Example 5 was first dissolved in fluorobenzene at a concentration of about 1.0 wt %, and the prepared coating liquid was spin-coated on a silicon wafer at a speed of 3000 rpm for 60 seconds, and then subjected to thermal cross-linking at about 200° C. to form a cross-linked neutral layer. The block copolymer (A) was dissolved in fluorobenzene at a concentration of about 1.0 wt %, and the prepared coating solution was spin-coated on the neutral layer at a rate of 3000 rpm for 60 seconds, and then subjected to thermal annealing at about 200° C. to form a membrane comprising the self-assembled block copolymer. FIG. 4 is an SEM image of the polymer membrane formed as described above. It can be confirmed from the drawing that a proper lamellar vertical orientation structure has been formed.

Example 4. Self-Assembly of the Block Copolymer (A) Introducing the Neutral Layer of the Random Copolymer (E)

Using the random copolymer (E) of Preparation Example 8 and the block copolymer (A) of Preparation Example 2, a cross-linked neutral layer and a self-assembled polymer membrane were formed, respectively, and the results were confirmed. Specifically, the random copolymer (E) of Preparation Example 8 was first dissolved in fluorobenzene at a concentration of about 1.0 wt %, and the prepared coating liquid was spin-coated on a silicon wafer at a speed of 3000 rpm for 60 seconds, and then subjected to thermal cross-linking at about 200° C. to form a cross-linked neutral layer. The block copolymer (A) was dissolved in fluorobenzene at a concentration of about 1.0 wt %, and the prepared coating solution was spin-coated on the neutral layer at a rate of 3000 rpm for 60 seconds, and then subjected to thermal annealing at about 200° C. to form a membrane comprising the self-assembled block copolymer. FIG. 5 is an SEM image of the polymer membrane formed as described above. It can be confirmed from the drawing that a proper lamellar vertical orientation structure has been formed.

Example 5. Self-Assembly of the Block Copolymer (A) Introducing the Neutral Layer of the Random Copolymer (F)

Using the random copolymer (F) of Preparation Example 9 and the block copolymer (A) of Preparation Example 2, a cross-linked neutral layer and a self-assembled polymer membrane were formed, respectively, and the results were confirmed. Specifically, the random copolymer (F) of Preparation Example 9 was first dissolved in fluorobenzene at a concentration of about 1.0 wt %, and the prepared coating liquid was spin-coated on a silicon wafer at a speed of 3000 rpm for 60 seconds, and then subjected to thermal cross-linking at about 200° C. to form a cross-linked neutral layer. The block copolymer (A) was dissolved in fluorobenzene at a concentration of about 1.0 wt %, and the prepared coating solution was spin-coated on the neutral layer at a rate of 3000 rpm for 60 seconds, and then subjected to thermal annealing at about 200° C. to form a membrane comprising the self-assembled block copolymer. FIG. 6 is an SEM image of the polymer membrane formed as described above. It can be confirmed from the drawing that a proper lamellar vertical orientation structure has been formed.

Referring to FIGS. 2 to 6, it can be confirmed that in the case of Examples 1 to 5, as the neutral layer composition comprising the random copolymer forms the neutral layer, the self-assembly structure of the block copolymer formed on the membrane containing the random copolymer is vertically oriented. On the other hand, referring to FIG. 1, it can be confirmed that in the case of the comparative example, the block copolymer does not exhibit uniform orientation characteristics when the membrane containing the block copolymer is formed on the substrate without neutral layer treatment.

The invention claimed is:

1. A neutral layer composition comprising:
a random copolymer having a unit of Formula 1 below:

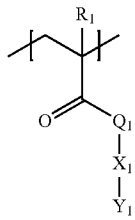

[Formula 1]

wherein, $R_1$ is hydrogen or an alkyl group having 1 to 4 carbon atoms, $Q_1$ is a single bond, —O-$L_1$-C(=O)— or —O-$L_1$-, $X_1$ is —N($R_2$)-$L_2$-C(=O)—O—, —O—C(=O)—, —C(=O)—O—, a urethane linker or a urea linker, where $L_1$ is an alkylene group having 1 to 4 carbon atoms, $L_2$ is an alkylene group having 1 to 4 carbon atoms or an alkylidene group having 2 to 4 carbon atoms and $R_2$ is hydrogen or an alkyl group having 1 to 4 carbon atoms, and $Y_1$ is a linear hydrocarbon that is unsubstituted or having one or more carbon atoms substituted with oxygen.

2. The neutral layer composition according to claim 1, wherein $Q_1$ is —O-$L_1$-C(=O)— and $L_1$ is an alkylene group having 1 to 4 carbon atoms.

3. The neutral layer composition according to claim 1, wherein $X_1$ is —N($R_2$)-$L_2$-C(=O)—O— and $L_2$ is an alkylene group having 1 to 4 carbon atoms or an alkylidene group having 2 to 4 carbon atoms.

4. The neutral layer composition according to claim 1, wherein $Y_1$ is a hydrocarbon chain having 8 to 20 carbon atoms.

5. The neutral layer composition according to claim 1, wherein $Y_1$ is an alkyl group having 8 to 20 carbon atoms.

6. The neutral layer composition according to claim 1, wherein the unit of Formula 1 in the random copolymer has a volume fraction in a range of 10% to 65%.

7. The neutral layer composition according to claim 1, wherein the random copolymer further comprises a unit represented by any one of Formula 2, 3, or 4:

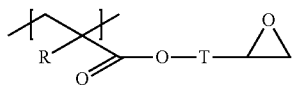

[Formula 2]

wherein, R is hydrogen or an alkyl group and T is a single bond or a divalent hydrocarbon group containing or not containing a hetero atom;

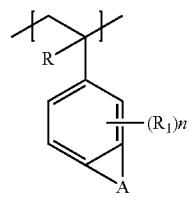

[Formula 3]

wherein, R is hydrogen or an alkyl group, A is an alkylene group, $R_1$ is hydrogen, a halogen atom, an alkyl group or a haloalkyl group, and n is a number in a range of 1 to 3;

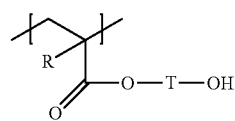

[Formula 4]

wherein, R is hydrogen or an alkyl group and T is a divalent hydrocarbon group containing or not containing a hetero atom.

8. The neutral layer composition according to claim 1, wherein the random copolymer further comprises a unit of Formula 6 below:

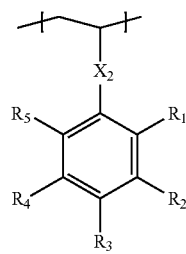

[Formula 6]

wherein, $X_2$ is a single bond, an oxygen atom or a sulfur atom, and $R_1$ to $R_5$ are each independently hydrogen, an alkyl group, a haloalkyl group or a halogen atom, wherein a number of halogen atoms contained in $R_1$ to $R_5$ is 3 or more.

9. The neutral layer composition according to claim 8, wherein the unit of Formula 6 in the random copolymer has a volume fraction in a range of 35% to 90%.

10. The neutral layer composition according to claim 1, wherein the random copolymer has a number average molecular weight in a range of 2,000 to 500,000.

11. A neutral layer comprising a random copolymer containing a unit of Formula 1 below:

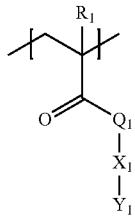

[Formula 1]

wherein, $R_1$ is hydrogen or an alkyl group having 1 to 4 carbon atoms, $Q_1$ is a single bond, —O-$L_1$-C(=O)— or —O-$L_1$- and $X_1$ is —N($R_2$)-$L_2$-C(=O)—O—, —O—C(=O)—, —C(=O)—O—, a urethane linker or a urea linker, where $L_1$ is an alkylene group having 1 to 4 carbon atoms, $L_2$ is an alkylene group having 1 to 4 carbon atoms or an alkylidene group having 2 to 4 carbon atoms and $R_2$ is hydrogen or an alkyl group having 1 to 4 carbon atoms, and $Y_1$ is linear hydrocarbon that is unsubstituted or having one or more carbon atoms substituted with oxygen.

12. A method for forming a neutral layer, comprising:
coating the neutral layer composition of claim 1 on a substrate to form a coated neutral layer; and
fixing the coated neutral layer.

13. A laminate comprising:
the neutral layer of claim 11; and
a polymer membrane formed on one surface of the neutral layer and containing a block copolymer having a first block and a second block different from the first block.

14. The laminate according to claim 13, wherein the block copolymer has a sphere, cylinder, gyroid or lamellar structure.

15. The laminate according to claim 13, wherein the first block of the block copolymer comprises a unit of Formula 1 below:

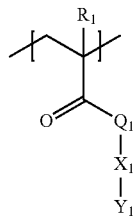

[Formula 1]

wherein, $R_1$ is hydrogen or an alkyl group having 1 to 4 carbon atoms, $Q_1$ is a single bond, —O-$L_1$-C(=O)— or —O-$L_1$-, $X_1$ is —N($R_2$)-$L_2$-C(=O)—O—, —O—C(=O)—, —C(=O)—O—, a urethane linker or a urea linker, where $L_1$ is an alkylene group having 1 to 4 carbon atoms, $L_2$ is an alkylene group having 1 to 4 carbon atoms or an alkylidene group having 2 to 4 carbon atoms and $R_2$ is hydrogen or an alkyl group having 1 to 4 carbon atoms, and $Y_1$ is a chain having 4 or more chain-forming atoms.

16. A method for manufacturing a laminate comprising:
forming the neutral layer of claim 11; and
forming a polymer membrane formed on one surface of the neutral layer and containing a block copolymer having a first block and a second block different from the first block in a self-assembled state.

17. A pattern forming method comprising:
selectively removing the first or second block of the block copolymer in the polymer membrane of the laminate of claim 13.

* * * * *